(12) United States Patent
Lee et al.

(10) Patent No.: US 9,831,436 B2
(45) Date of Patent: *Nov. 28, 2017

(54) ORGANIC PHOTOELECTRONIC DEVICE AND IMAGE SENSOR

(71) Applicant: Samsung Electronics Co., Ltd., Suwon-si, Gyeonggi-do (KR)

(72) Inventors: Kwang Hee Lee, Yongin-si (KR); Gae Hwang Lee, Seongnam-si (KR); Dong-Seok Leem, Hwaseong-si (KR); Tadao Yagi, Hwaseong-si (KR); Xavier Bulliard, Seongnam-si (KR); Yong Wan Jin, Seoul (KR); Kyung Bae Park, Hwaseong-si (KR); Sungdong Suh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/295,382

(22) Filed: Oct. 17, 2016

(65) Prior Publication Data

US 2017/0040544 A1 Feb. 9, 2017

Related U.S. Application Data

(63) Continuation of application No. 14/670,021, filed on Mar. 26, 2015, now Pat. No. 9,502,473.

(30) Foreign Application Priority Data

Aug. 28, 2014 (KR) ........................ 10-2014-0113220

(51) Int. Cl.
*H01L 35/24* (2006.01)
*H01L 51/00* (2006.01)
(Continued)

(52) U.S. Cl.
CPC ........ *H01L 51/0053* (2013.01); *H01L 27/307* (2013.01); *H01L 51/008* (2013.01); *H01L 51/4253* (2013.01)

(58) Field of Classification Search
CPC .......................... H01L 51/0053; H01L 51/008
(Continued)

(56) References Cited

U.S. PATENT DOCUMENTS 6,451,415 B1 9/2002 Forrest et al.
7,026,041 B2 4/2006 Forrest et al.
(Continued)

FOREIGN PATENT DOCUMENTS

EP 0031065 A2 7/1981
JP 2009290190 A 12/2009
(Continued)

OTHER PUBLICATIONS

Kristin L. Mutolo et al. "Enhanced Open-Circuit Voltage in Subphthalocyanine/C60 Organic Photovoltaic Cells", JACS, J. Am. Chem. Soc. 2006, 128, pp. 8108-8109.
(Continued)

*Primary Examiner* — Anthony Ho
(74) *Attorney, Agent, or Firm* — Harness, Dickey & Pierce, P.L.C.

(57) ABSTRACT

An organic photoelectronic device includes a first electrode and a second electrode facing each other, and an active layer between the first electrode and the second electrode, the active layer including a first compound having a maximum absorption wavelength of about 500 nm to about 600 nm in a visible ray region and a transparent second compound in a visible ray region. The transparent second compound has an absorption coefficient in a thin film state of less than or equal to about $0.1 \times 10^5$ cm$^{-1}$ in a wavelength region of about 450 nm to about 700 nm.

23 Claims, 14 Drawing Sheets

(51) Int. Cl.
*H01L 27/30* (2006.01)
*H01L 51/42* (2006.01)

(58) Field of Classification Search
USPC .......................................................... 257/40
See application file for complete search history.

(56) References Cited

U.S. PATENT DOCUMENTS

| 7,863,605 | B2 | 1/2011 | Hayashi |
| 7,973,307 | B2 | 7/2011 | Rand et al. |
| 8,242,493 | B2 | 8/2012 | Rand et al. |
| 9,502,473 | B2* | 11/2016 | Bluck .................. H01L 27/307 |

FOREIGN PATENT DOCUMENTS

| JP | 4677314 B2 | 4/2011 |
| KR | 20110119710 A | 11/2011 |
| KR | 20120083294 A | 7/2012 |

OTHER PUBLICATIONS

Eilaf Ahmed et al. "Design of New Electron Acceptor Materials for Organic Photovoltaics: Synthesis, Electron Transport, Photophysics, and Photovoltaic Properties of Oligothiophene-Functionalized Naphthalene Diimides", Chemistry of material, Sep. 30, 2011, Chem. Mater. 2011, 23, pp. 4563-4577.

Clayton E. Mauldin "Axial Thiophene-Boron(subphthalocyanine) Dyads and Their Application in Organic Photovoltaics", Applied material & interface, Sep. 8, 2010, vol. 2, No. 10, pp. 2833-2838.

Solution Processing of a Small Molecule, Subnaphthalocyanine, for Efficient Organic Photovoltaic Cells, Chemistry material, Apr. 2, 2009, Chem. Mater. 2009, 21, 1413-1417.

Hokuto Seo et al. "Color Sensors with Three Vertically Stacked Organic Photodetectors", Japanese Journal of Applied Physics, vol. 46, No. 49, NHK Science and Technical Research Labor, 2007, L1240-L1242.

Satoshi Aihara et al. "Stacked Image Sensor With Green- and Red-Sensitive Organic Photoconductive Films Applying Zinc Oxide Thin-Film Transistors to a Signal Readout Circuit", IEE Transactions on Elecron Devices, vol. 56, No. 11, Nov. 2009, pp. 2570-2576.

Mikio Ihama et al. "CMOS Image Sensor with a Thin Overlaid Panchromatic Organic Photoconductive Layer for Sensors with Reduced Pixel Size", IDW, Fujifilm Corporation, 2009, pp. 2123-2126.

* cited by examiner

ORGANIC PHOTOELECTRONIC DEVICE AND IMAGE SENSOR

CROSS REFERENCE TO RELATED APPLICATION

This application is a continuation application of U.S. patent application Ser. No. 14/670,021, filed on Mar. 26, 2015, which claims priority to and the benefit of Korean Patent Application No. 10-2014-0113220 filed in the Korean Intellectual Property Office on Aug. 28, 2014, the entire contents of each of which are incorporated herein by reference.

BACKGROUND

1. Field

Example embodiments relate to an organic photoelectronic device and an image sensor.

2. Description of the Related Art

A photoelectronic device converts light into an electrical signal using photoelectronic effects, and may include a photodiode and/or a phototransistor. The photoelectronic device may be applied to an image sensor, a solar cell and/or an organic light emitting diode.

An image sensor including a photodiode requires relatively high resolution and thus a relatively small pixel. At present, a silicon photodiode is widely used, but the silicon photodiode has a problem of deteriorated sensitivity and has a relatively small absorption area due to relatively small pixels. Accordingly, an organic material that is capable of replacing silicon has been researched.

The organic material has a relatively high extinction coefficient and selectively absorbs light in a particular wavelength region depending on a molecular structure, and thus may simultaneously replace a photodiode and a color filter and resultantly improve sensitivity and contribute to relatively high integration.

SUMMARY

Example embodiments provide an organic photoelectronic device having improved photoelectric conversion efficiency and wavelength selectivity.

Example embodiments also provide an image sensor including the organic photoelectronic device.

According to example embodiments, an organic photoelectronic device includes a first electrode and a second electrode facing each other, and an active layer between the first electrode and the second electrode, the active layer including a first compound having a maximum absorption wavelength of about 500 nm to about 600 nm in a visible ray region and a transparent second compound in a visible ray region. The transparent second compound has an absorption coefficient in a thin film state of less than or equal to about $0.1 \times 10^5$ cm$^{-1}$ in a wavelength region of about 450 nm to about 700 nm.

The transparent second compound may have an energy bandgap of greater than or equal to about 2.8 eV.

According to example embodiments, an organic photoelectronic device includes a first electrode and a second electrode facing each other, and an active layer between the first electrode and the second electrode, the active layer including a first compound having a maximum absorption wavelength of about 500 nm to about 600 nm in a visible ray region and a transparent second compound in a visible ray region. The transparent second compound has an absorption coefficient in a thin film state of less than or equal to about $0.4 \times 10^5$ cm$^{-1}$ in a wavelength region of about 400 nm to about 700 nm.

The transparent second compound may have an absorption coefficient in a thin film state of less than or equal to about $0.3 \times 10^5$ cm$^{-1}$ in a wavelength region of about 450 nm to about 700 nm.

The active layer may have a thickness of about 1 nm to about 500 nm.

The transparent second compound may have a HOMO level of greater than about 6.0 eV.

The difference between the HOMO level of the transparent second compound and the work function of the second electrode may be greater than or equal to about 1.5 eV.

The transparent second compound may be represented by the following Chemical Formula 1.

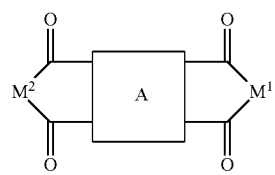

[Chemical Formula 1]

In the Chemical Formula 1,

A is one of a substituted or unsubstituted $C_6$ to $C_{30}$ aromatic ring group, a substituted or unsubstituted $C_3$ to $C_{30}$ hetero aromatic ring group, and a combination thereof, and each of $M^1$ and $M^2$ are independently one of oxygen (—O—) and —NR$^0$—, wherein R$^0$ is one of hydrogen, a substituted or unsubstituted $C_1$ to $C_{30}$ alkyl group, a substituted or unsubstituted $C_3$ to $C_{30}$ cycloalkyl group, a halogen atom, a halogen-containing group, and a combination thereof.

The transparent second compound may be represented by one of the following Chemical Formulae 1a to 1e.

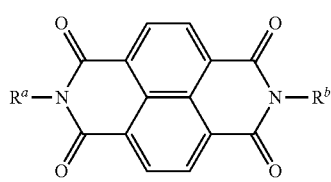

[Chemical Formula 1a]

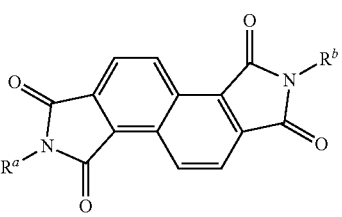

[Chemical Formula 1b]

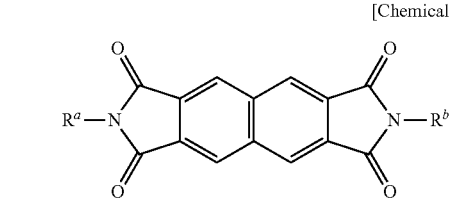

[Chemical Formula 1c]

-continued

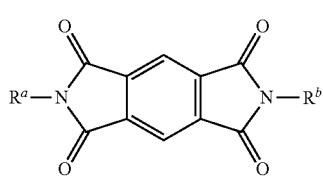
[Chemical Formula 1d]

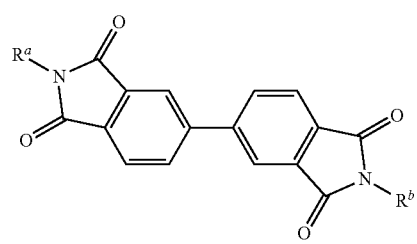
[Chemical Formula 1e]

In the Chemical Formulae 1a to 1e, each of $R^a$ and $R^b$ are independently one of hydrogen, a substituted or unsubstituted $C_1$ to $C_{30}$ alkyl group, a substituted or unsubstituted $C_3$ to $C_{30}$ cycloalkyl group, a halogen atom, a halogen-containing group, and a combination thereof.

The first compound may include N,N'-dimethylquinacridone (DMQA), N,N'-dimethyl-2,9-dimethylquinacridone (DMMQA), a compound represented by the following Chemical Formula 2, or a combination thereof.

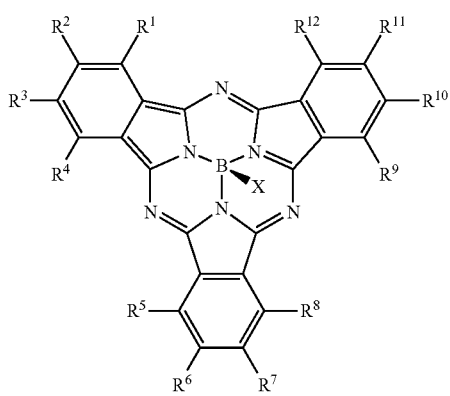
[Chemical Formula 2]

In the Chemical Formula 2, each of $R^1$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and X is an anion.

The first compound may have an energy bandgap of greater than or equal to about 2.0 eV and less than or equal to about 2.5 eV.

The first compound may have a maximum absorption wavelength ($\lambda_{max}$) of about 530 nm to about 600 nm.

The active layer may show a light absorption curve having a full width at half maximum (FWHM) of about 50 nm to about 200 nm.

The active layer may show a light absorption curve having a full width at half maximum (FWHM) of about 50 nm to about 150 nm.

The first compound may be a p-type semiconductor, and the transparent second compound may be an n-type semiconductor.

The active layer may selectively absorb light in a green wavelength region.

A hole blocking layer may not be between the first electrode and the active layer and between the second electrode and the active layer.

According to example embodiments, an image sensor includes the organic photoelectronic device.

The image sensor may include a semiconductor substrate integrated with a first photo-sensing device sensing light in a blue wavelength region and a second photo-sensing device sensing light in a red wavelength region, and the organic photoelectronic device may be on the semiconductor substrate and absorbs light in a green wavelength region.

The first photo-sensing device and the second photo-sensing device may be positioned at a different depth from the surface of the semiconductor substrate.

The image sensor may further include a color filter layer on or under the organic photoelectronic device.

The color filter layer may be between the semiconductor substrate and the organic photoelectronic device and the color filter layer may include a first color filter corresponding to the first photo-sensing device and selectively transmitting light in a blue region, and a second color filter corresponding to the second photo-sensing device and selectively transmitting light in a red region.

DETAILED DESCRIPTION

Figure 1:
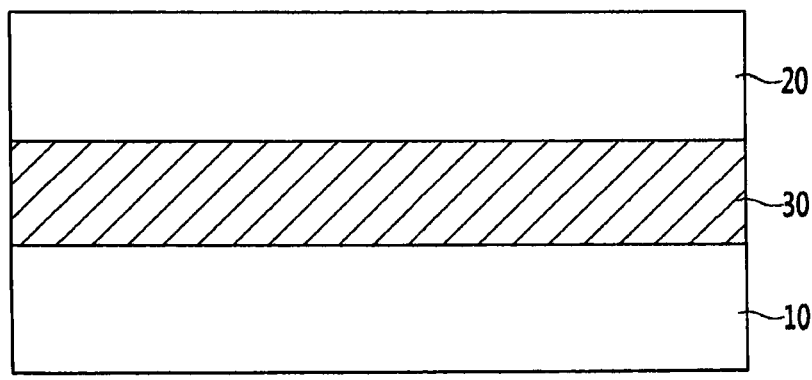
FIG. 1 is a cross-sectional view of an organic photoelectronic device according to example embodiments.

Example embodiments will hereinafter be described in detail, and may be more easily performed by those who have common knowledge in the related art. However, this disclosure may be embodied in many different forms and is not to be construed as limited to the example embodiments set forth herein.

It will be understood that when an element or layer is referred to as being "on," "connected to," "coupled to," or "covering" another element or layer, it may be directly on, connected to, coupled to, or covering the other element or layer, or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of the example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

As used herein, when a definition is not otherwise provided, the term "substituted" refers to one substituted with at least a functional group selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, a $C_1$ to $C_4$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_2$ to $C_{20}$ heterocycloalkyl group, and a combination thereof, instead of hydrogen of a compound.

As used herein, when specific definition is not otherwise provided, the term "hetero" refers to one including 1 to 3 heteroatoms selected from N, O, S, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

Hereinafter, referring to the drawings, an organic photoelectronic device according to example embodiments is described.

FIG. 1 is a cross-sectional view showing an organic photoelectronic device according to example embodiments.

Referring to FIG. 1, an organic photoelectronic device 100 according to example embodiments includes a first electrode 10 and a second electrode 20 facing each other, and an active layer 30 between the first electrode 10 and the second electrode 20.

One of the first electrode 10 and the second electrode 20 is an anode and the other is a cathode. At least one of the first electrode 10 and the second electrode 20 may be a light-transmitting electrode, and the light-transmitting electrode may be made of, for example, a transparent conductor (e.g., indium tin oxide (ITO) or indium zinc oxide (IZO)), or a metal thin layer of a thin monolayer or multilayer. When one of the first electrode 10 and the second electrode 20 is a non-light-transmitting electrode, the one of the first electrode 10 and the second electrode 20 may be made of, for example, an opaque conductor (e.g., aluminum (Al)).

The active layer 30 includes a mixed p-type semiconductor material and n-type semiconductor material to form a pn junction, and receives external light, produces excitons, and separates the excitons into holes and electrons.

The active layer 30 includes a first compound absorbing visible light and a transparent second compound in a visible ray region.

The first compound has a maximum absorption wavelength ($\lambda_{max}$) of about 500 nm to about 600 nm in a visible ray region, for example, about a maximum absorption wavelength of about 530 nm to about 600 nm.

The first compound may be a p-type semiconductor, and may have, for example, an energy bandgap of about greater than or equal to about 2.0 eV and less than or equal to about 2.5 eV.

For example, the first compound may include N,N'-dimethylquinacridone (DMQA), N,N'-dimethyl-2,9-dimethylquinacridone (DMMQA), a compound represented by the following Chemical Formula 2 (boron subphthalocyanine, SubPc, sub-phthalocyanine), or a combination thereof.

[Chemical Formula 2]

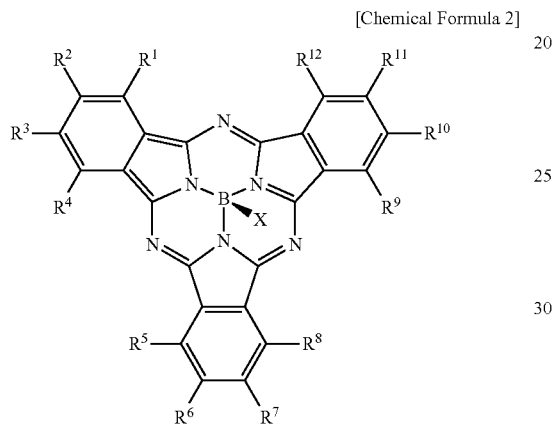

In the Chemical Formula 2, each of $R^1$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and X is an anion.

The compound represented by the Chemical Formula 2 may be one of the compounds represented by the following Chemical Formulae 2a to 2e, but is not limited thereto.

[Chemical Formula 2a]

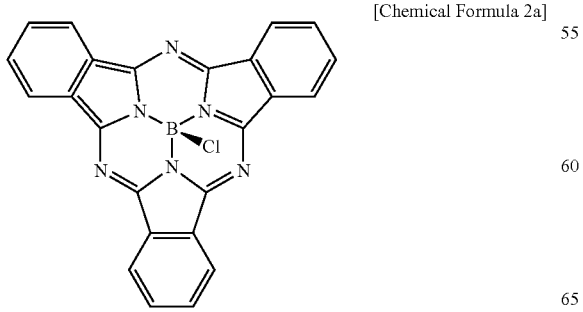

[Chemical Formula 2b]

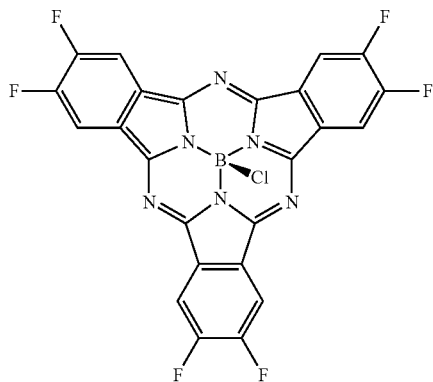

[Chemical Formula 2c]

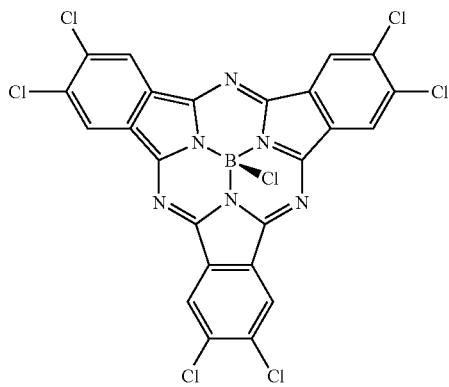

[Chemical Formula 2d]

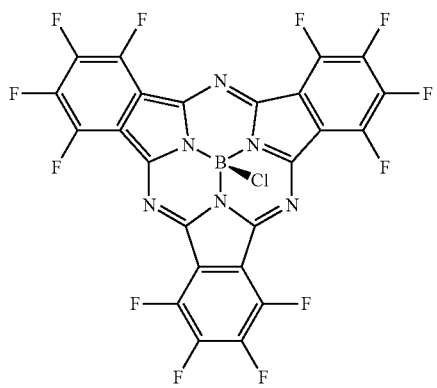

[Chemical Formula 2e]

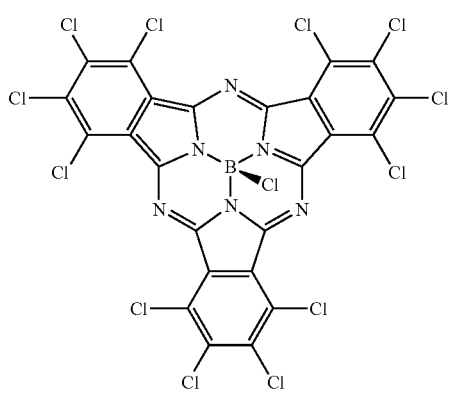

Hereinafter, the second compound is described.

The second compound has transparency for transmitting light, and may not substantially absorb visible light in about a 450 nm to about a 700 nm wavelength region.

The second compound may have, for example, an energy bandgap of greater than or equal to about 2.8 eV, and may have, for example, a HOMO level of greater than about 6.0 eV and less than about 8.5 eV. In addition, the difference between the HOMO level of the second compound and the work function of the second electrode may be, for example, greater than or equal to about 1.5 eV. Herein, the HOMO level refers to an absolute value when a vacuum level is 0 eV.

For example, the second compound may be represented by the following Chemical Formula 1.

[Chemical Formula 1]

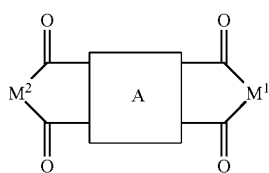

In the Chemical Formula 1,

A is one of a substituted or unsubstituted $C_6$ to $C_{30}$ aromatic ring group, a substituted or unsubstituted $C_3$ to $C_{30}$ hetero aromatic ring group, and a combination thereof, and each of $M^1$ and $M^2$ are independently one of oxygen (—O—) and —$NR^o$—, wherein the $R^o$ is one of hydrogen, a substituted or unsubstituted $C_1$ to $C_{30}$ alkyl group, a substituted or unsubstituted $C_3$ to $C_{30}$ cycloalkyl group, a halogen atom, a halogen-containing group, and a combination thereof.

The hetero aromatic ring group refers to an aromatic ring group including at least one heteroatom in a ring.

In the Chemical Formula 1, the bonding position of the A is not particularly limited.

For example, the A may be a substituted or unsubstituted C6 to C30 acene group.

In the Chemical Formula 1, when the $M^1$ and $M^2$ are represented by the —$NR^o$—, the $M^1$ and $M^2$ may be the same as or different from each other. The second compound may be represented by one of the following Chemical Formulae 1a to 1e, but is not limited thereto.

[Chemical Formula 1a]

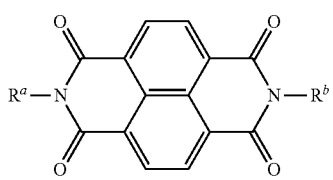

[Chemical Formula 1b]

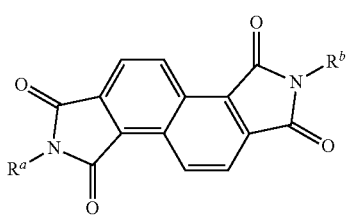

[Chemical Formula 1c]

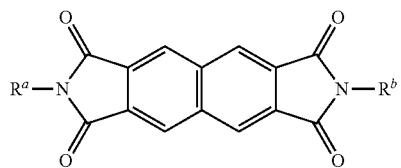

[Chemical Formula 1d]

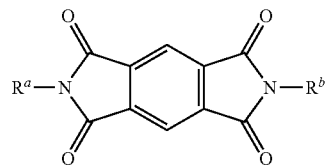

[Chemical Formula 1e]

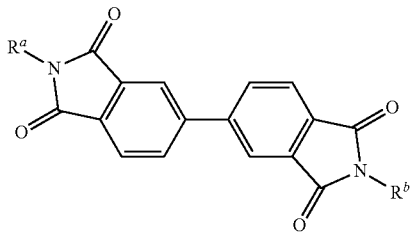

In the Chemical Formulae 1a to 1e, each of $R^a$ and $R^b$ are independently one of hydrogen, a substituted or unsubstituted $C_1$ to $C_{30}$ alkyl group, a substituted or unsubstituted $C_3$ to $C_{30}$ cycloalkyl group, a halogen atom, a halogen-containing group, and a combination thereof.

In the Chemical Formula 1, when the $M^1$ and $M^2$ are oxygen (—O—), the second compound may be, for example, pyromellitic dianhydride (PMDA) or 1,4,5,8-naphthalene tetracarboxylic dianhydride (NTCDA), but is not limited thereto.

The active layer 30 may show a light absorption curve having a relatively small full width at half maximum (FWHM) of about 50 nm to about 200 nm, about 50 nm to about 150 nm, or about 50 nm to about 120 nm. Herein, the FWHM is a width of a wavelength corresponding to half of a maximum absorption point. As used herein, when specific definition is not otherwise provided, it may be defined by absorbance measured by UV-Vis spectroscopy. Within the FWHM range, selectivity for a green wavelength region may be increased.

The active layer 30 may be a single layer or a multilayer. The active layer 30 may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a thickness ratio of about 1:100 to about 100:1. The compounds may be included in a thickness ratio ranging from about 1:50 to about 50:1 within the range, specifically, about 1:10 to about 10:1, and more specifically, about 1:about 1. When the p-type and n-type semiconductors have a composition ratio within the range, an exciton may be effectively produced and a pn junction may be effectively formed.

The p-type layer may include the p-type semiconductor, and the n-type layer may include the n-type semiconductor.

The active layer 30 may have a thickness of about 1 nm to about 500 nm, for example, about 5 nm to about 300 nm.

Within the thickness range, the active layer may effectively absorb light, effectively separate holes from electrons, and deliver them, thereby effectively improving photoelectronic conversion efficiency.

In the organic photoelectronic device 100, when light enters from the first electrode 10 and/or second electrode 20, and when the active layer 30 absorbs light having a given (or alternatively, predetermined) wavelength region, excitons may be produced from the inside. The excitons are separated into holes and electrons in the active layer 30, the separated holes are transported to an anode that is one of the first electrode 10 and second electrode 20 and the separated electrons are transported to the cathode that is the other of and the first electrode 10 and second electrode 20 so as to flow a current in the organic photoelectronic device. The active layer 30 selectively absorbs light in a green wavelength region.

In general, since a reverse voltage is externally applied to at most sense charges produced by radiating light, counter charges may be injected from an electrode to an active layer due to the externally applied voltage. These counter charges are measured as a dark current, which may increase noise.

The organic photoelectronic device 100 includes the active layer 30 including the first and second compounds, and thus may be efficiently blocked from charges inflowing from the outside as well as have high photoelectric efficiency.

Accordingly, the organic photoelectronic device 100 may not only deteriorate photoelectric conversion characteristics but also secure an improved contrast ratio.

Hereinafter, an organic photoelectronic device according to example embodiments is described referring to FIG. 2.

Figure 2:
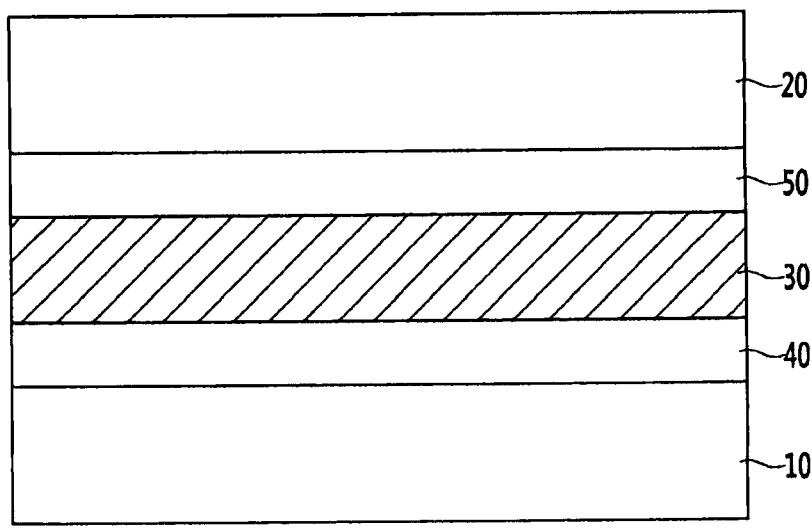
FIG. 2 is a cross-sectional view of an organic photoelectronic device according to example embodiments.

FIG. 2 is a cross-sectional view showing an organic photoelectronic device according to example embodiments.

Referring to FIG. 2, an organic photoelectronic device 200 according to example embodiments includes a first electrode 10 and a second electrode 20 facing each other, and an active layer 30 interposed between the first electrode 10 and the second electrode 20, like the example embodiments as illustrated in FIG. 1.

However, the organic photoelectronic device 200 according to example embodiments may further include charge auxiliary layers 40 and 50 between the first electrode 10 and the active layer 30, and the second electrode 20 and the active layer 30, unlike the example embodiments as illustrated in FIG. 1. The charge auxiliary layers 40 and 50 may facilitate the transfer of holes and electrons separated from the active layer 30, so as to increase efficiency.

In general, examples of the charge auxiliary layer may be a hole injection layer (HIL) for facilitating hole injection, a hole transport layer (HTL) for facilitating hole transport, an electron blocking layer (EBL) for preventing or inhibiting electron transport, an electron injection layer (EIL) for facilitating electron injection, an electron transport layer (ETL) for facilitating electron transport, and a hole blocking layer (HBL) for preventing or inhibiting hole transport.

However, the organic photoelectronic device 100 according to example embodiments includes the first and second compounds, and thus may block charges inflowing from the outside and needs no separate hole blocking layer (HBL). Accordingly, generation of a dark current as well as a decrease of photoelectric efficiency caused by formation of multi-layered interfaces may be prevented or inhibited.

For example, the charge auxiliary layers 40 and 50 may be at least one selected from a hole injection layer (HIL) for facilitating hole injection, a hole transport layer (HTL) for facilitating hole transport, an electron injection layer (EIL) for facilitating electron injection, and an electron transport layer (ETL) for facilitating electron transport.

The charge auxiliary layers 40 and 50 may include, for example, an organic material, an inorganic material, or an organic/inorganic material. The organic material may be an organic compound having hole or electron characteristics, and the inorganic material may be, for example, a metal oxide (e.g., molybdenum oxide, tungsten oxide, and nickel oxide).

The hole transport layer (HTL) may include one selected from, for example, poly(3,4-ethylenedioxythiophene):poly (styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the charge auxiliary layers 40 and 50 may be omitted. In the organic photoelectronic device 100, a hole blocking layer may not be interposed between the first electrode 10 and the active layer 30 or between the second electrode 20 and the active layer 30.

The organic photoelectronic device may be applied to various fields, for example a solar cell, an image sensor, a photo-detector, a photo-sensor, and an organic light emitting diode (OLED), but is not limited thereto.

Hereinafter, an example of an image sensor including the organic photoelectronic device is described referring to drawings. As an example, an image sensor is described.

Figure 3:
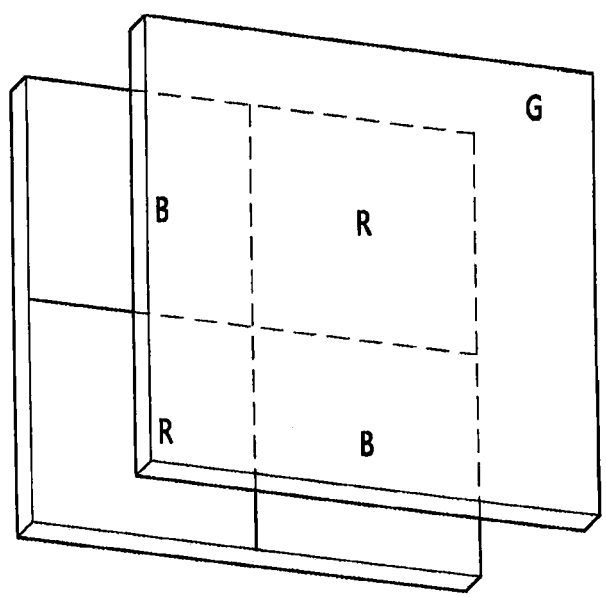
FIG. 3 is a schematic top plan view showing an image sensor according to example embodiments.
Figure 4:
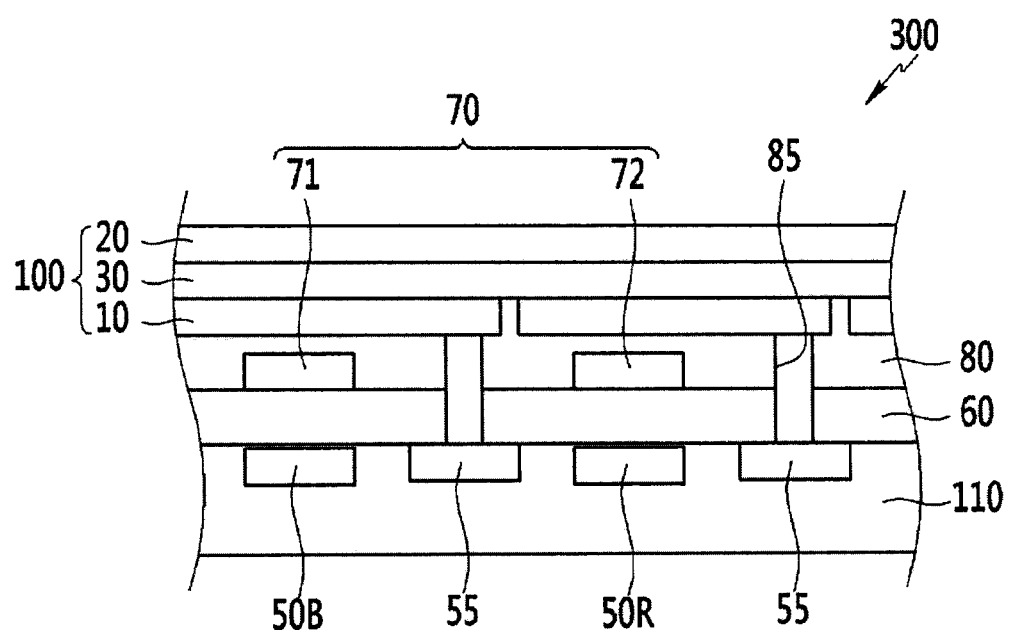
FIG. 4 is a cross-sectional view showing the image sensor of FIG. 3.

FIG. 3 is a schematic top plan view of an image sensor according to example embodiments, and FIG. 4 is a cross-sectional view of the image sensor of FIG. 3.

Referring to FIGS. 3 and 4, an image sensor 300 according to example embodiments includes a semiconductor substrate 110 integrated with a first photo-sensing device 50B sensing light in a blue wavelength region and a second photo-sensing device 50R sensing light in a red wavelength region, a transmission transistor (not shown), and a charge storage device 55, a lower insulation layer 60, a color filter layer 70, an upper insulation layer 80, and the organic photoelectronic device 100.

The semiconductor substrate 110 may be a silicon substrate, and is integrated with the photo-sensing devices 50B and 50R, the transmission transistor (not shown), and the charge storage device 55. The photo-sensing devices 50B and 50R may be photodiodes.

The photo-sensing devices 50B and 50R, the transmission transistor, and/or the charge storage device 55 may be integrated in each pixel, and as shown in the drawing, the photo-sensing devices 50B and 50R may be included in a blue pixel and a red pixel and the charge storage device 55 may be included in a green pixel.

The photo-sensing devices 50B and 50R sense light, the information sensed by the photo-sensing devices may be transferred by the transmission transistor, the charge storage device 55 is electrically connected with the organic photoelectronic device 100, and the information of the charge storage device 55 may be transferred by the transmission transistor.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but are not limited thereto. Further, it is not limited to the structure, and the metal wire and pad may be positioned under the photo-sensing devices 50B and 50R.

The lower insulation layer 60 is formed on the metal wire and the pad. The lower insulation layer 60 may be made of an inorganic insulating material (e.g., a silicon oxide and/or a silicon nitride), or a low dielectric constant (low K) material (e.g., SiC, SiCOH, SiCO, and SiOF). The lower insulation layer 60 has a trench exposing the charge storage device 55. The trench may be filled with fillers.

The color filter layer 70 is formed on the lower insulation layer 60.

For example, the color filter layer 70 may be positioned between the semiconductor substrate 110 and the organic photoelectronic device 100, and in example embodiments as illustrated in FIG. 4, may include a first color filter 71 that corresponds to the first photo-sensing device 50B and selectively transmits light in a blue wavelength region, and a second color filter 72 that corresponds to the second photo-sensing device 50R and selectively transmits light in a red wavelength region. For example, the first color filter 71 may be a blue filter and the second color filter 72 may be a red filter.

The color filter layer may be positioned on the organic photoelectronic device, unlike FIG. 4. In example embodiments, the color filter layer may include a first color filter corresponding to the first photo-sensing device and selectively transmitting lights in blue and green regions and a second color filter corresponding to the second photo-sensing device and selectively transmitting light in red and green regions. For example, the first color filter may be a cyan filter, and the second color filter may be a yellow filter.

The upper insulation layer 80 is formed on the color filter 70. The upper insulation layer 80 eliminates a step caused by the color filter layer 70 and smoothes the surface. The upper insulation layer 80 and the lower insulation layer 60 may include a contact hole (not shown) exposing a pad, and a through-hole 85 exposing the charge storage device 55 of the green pixel.

The organic photoelectronic device 100 is formed on the upper insulation layer 80. The organic photoelectronic device 100 includes the first electrode 10, the active layer 30, and the second electrode 20 as described above.

The first electrode 10 and the second electrode 20 may be transparent electrodes, and the active layer 30 may include a first compound having a maximum absorption wavelength of about 500 nm to about 600 nm in a visible ray region, and a transparent second compound in a visible ray region as described above.

The active layer 30 selectively absorbs light in a green wavelength region and replaces a color filter of a green pixel.

When light enters from the second electrode 20, the light in a green wavelength region may be mainly absorbed in the active layer 30 and photoelectrically converted, while the light in the rest of the wavelength regions passes through first electrode 10 and may be sensed in the photo-sensing devices 50B and 50R.

According to example embodiments, a hole blocking layer is not interposed between the first electrode 10 and the active layer 30 or between the second electrode 20 and the active layer 30, and thereby a size of an image sensor 300 may be decreased and a down-sized image sensor may be realized.

In FIG. 4, the first photo-sensing device 50B sensing light in a blue wavelength region and the second photo-sensing device 50R sensing light in a red wavelength region may be spaced apart from each other in a horizontal direction at substantially equivalent depths from the surface of the semiconductor substrate 110. However, according to example embodiments, the first photo-sensing device 50B and the second photo-sensing device 50R may be positioned at different depths from the surface of the semiconductor substrate 110. The above structure is described referring to FIG. 5.

Figure 5:
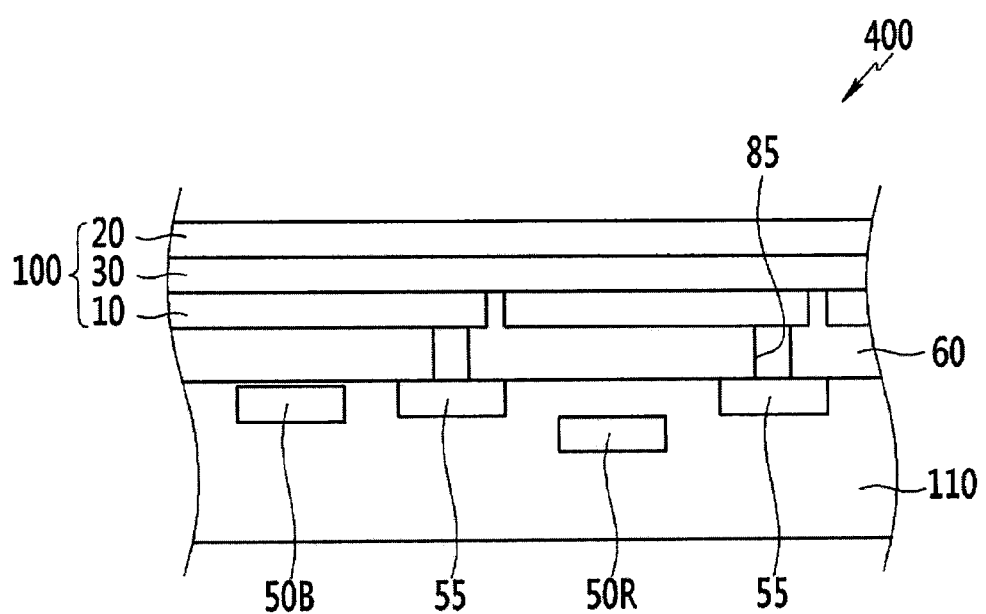
FIG. 5 is another cross-sectional view of the image sensor of FIG. 3.

Referring to FIG. 5, in the image sensor 400, according to example embodiments, the first photo-sensing device 50B and the second photo-sensing device 50R may be positioned at different depths from the surface of the semiconductor substrate 110, and the second photo-sensing device 50R sensing light in a relatively long wavelength region may be positioned more deeply from the surface of the semiconductor substrate 110 than the first photo-sensing device 50B sensing light in a shorter wavelength region. The first photo-sensing device 50B and the second photo-sensing device 50R may selectively absorb light in each wavelength region depending on a stack depth. Accordingly, the color filter layer 70 may be omitted.

Referring to FIGS. 4 and 5, the first photo-sensing device 50B sensing light in a blue wavelength region and the second photo-sensing device 50R sensing light in a red wavelength region are integrated in the semiconductor substrate 110, and the organic photoelectronic device 100 includes an organic photoelectric conversion layer 30 selectively absorbing light in a green wavelength region. However, the organic photoelectronic device 100 is not limited to the above structure shown in FIG. 2. The following structures may be embodied: a photo-sensing device sensing light in a blue wavelength region and a photo-sensing device sensing light in a green wavelength region may be integrated in the semiconductor substrate 110, and the organic photoelectronic device 100 includes an active layer 30 selectively absorbing light in a red wavelength region; or alternatively, a photo-sensing device sensing light in a red wavelength region and a photo-sensing device sensing light in a green wavelength region may be integrated in the semiconductor substrate 110, and the organic photoelectronic device 100 includes an organic photoelectric conversion layer 30 selectively absorbing light in a blue wavelength region.

Herein, the red wavelength region may have, for example, a maximum absorption wavelength ($\lambda_{max}$) of greater than about 580 nm and less than or equal to about 700 nm, the blue wavelength region may have, for example, a maximum absorption wavelength ($\lambda_{max}$) of greater than or equal to about 400 nm and less than about 500 nm, and the green wavelength region may have, for example, a maximum absorption wavelength ($\lambda_{max}$) of about 500 nm to about 580 nm.

Figure 6:
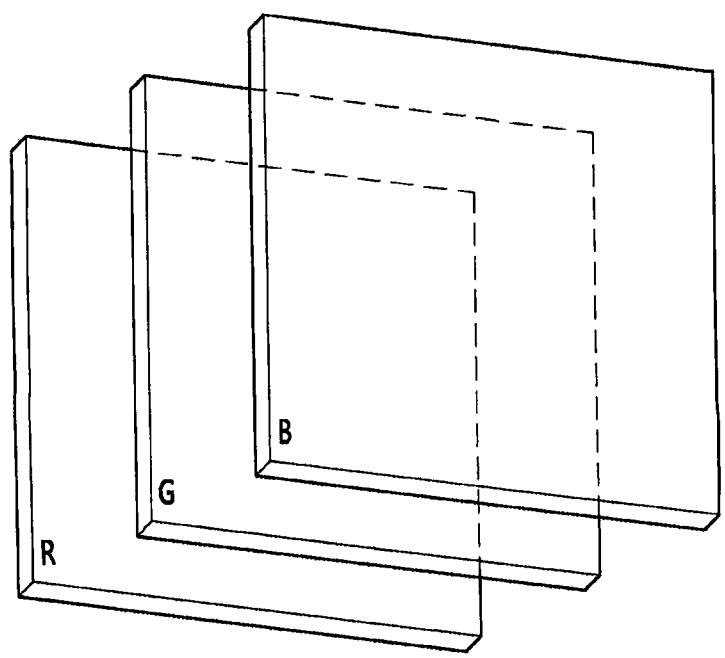
FIG. 6 is a schematic top plan view of an image sensor according to example embodiments.

FIG. 6 is a schematic top plan view of an image sensor according to example embodiments.

The image sensor according to example embodiments includes a green photoelectronic device selectively absorbing light in a green wavelength region, a blue photoelectronic device selectively absorbing light in a blue wavelength region, and a red photoelectronic device selectively absorbing light in a red wavelength region and that are stacked.

In the drawing, the red photoelectronic device, the green photoelectronic device, and the blue photoelectronic device are sequentially stacked, but the order in which the photoelectronic devices are stacked may be changed without limitation.

The green photoelectronic device may be the above organic photoelectronic device 100, the blue photoelectronic device may include electrodes facing each other and an active layer interposed therebetween and including an organic material selectively absorbing light in a blue wavelength region, and the red photoelectronic device may include electrodes facing each other and an active layer interposed therebetween and including an organic material selectively absorbing light in a red wavelength region.

As described above, the organic photoelectronic device selectively absorbing light in a red wavelength region, the organic photoelectronic device selectively absorbing light in a green wavelength region, and the organic photoelectronic device selectively absorbing light in a blue wavelength region are stacked, and thereby a size of an image sensor may be decreased and a down-sized image sensor may be realized.

Hereinafter, the present disclosure is illustrated in more detail with reference to examples. However, these are examples, and the present disclosure is not limited thereto.
Second Compound Compounds represented by the following Chemical Formulae 1aa to 1gg are synthesized, referring to J. Mater. Chem. C, 2013, 1, 5395-5401.

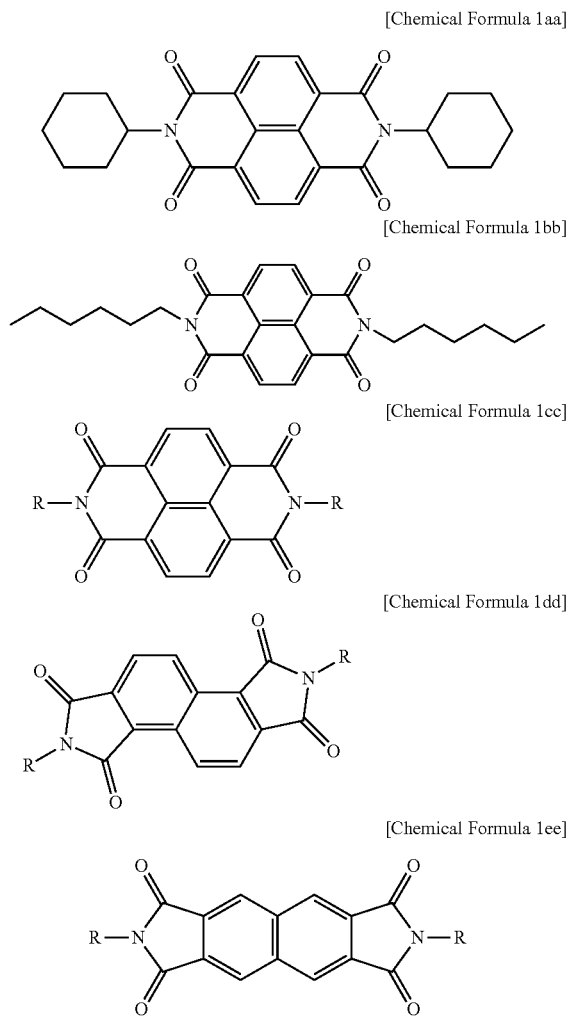

[Chemical Formula 1aa]

[Chemical Formula 1bb]

[Chemical Formula 1cc]

[Chemical Formula 1dd]

[Chemical Formula 1ee]

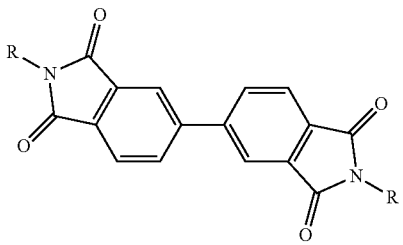

[Chemical Formula 1ff]

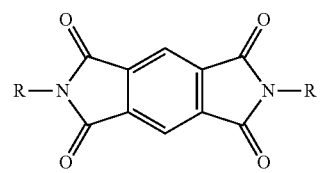

[Chemical Formula 1gg]

In the Chemical Formulae 1cc to 1gg, R is —$CH_3$.

Evaluation I

Evaluation 1: Light Absorption Characteristics

The light absorption characteristics of the compounds represented by the above Chemical Formulae 1aa and 1bb depending on a wavelength are evaluated. The light absorption characteristics are evaluated in a thin film state.

The light absorption characteristics of the compounds represented by the above Chemical Formula 1aa and Chemical Formula 1bb in a thin film state are evaluated by thermally evaporating the compounds under high vacuum (<$10^{-7}$ Torr) at a speed of 0.5-1.0 Å/s to form each 70 nm-thick thin film and radiating an ultraviolet (UV)-visible ray (UV-Vis) into the film with a Cary 5000 UV spectroscope (Varian Inc.).

Figure 7:
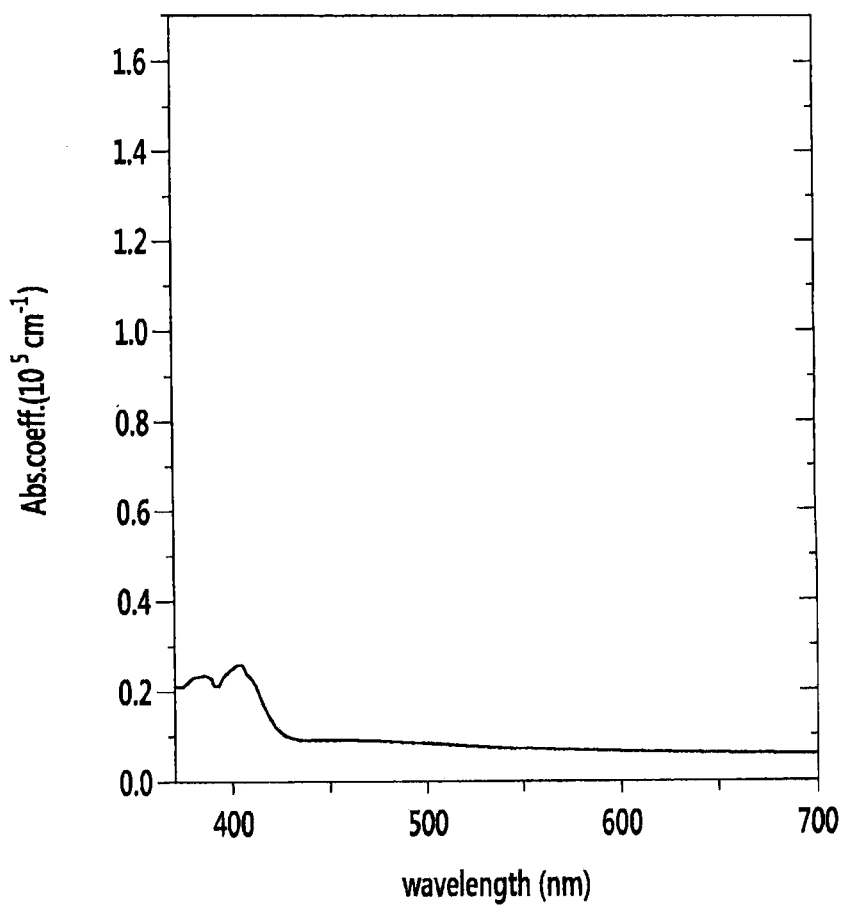
FIG. 7 is a graph showing light absorption characteristics of the compound represented by Chemical Formula 1aa.
Figure 8:
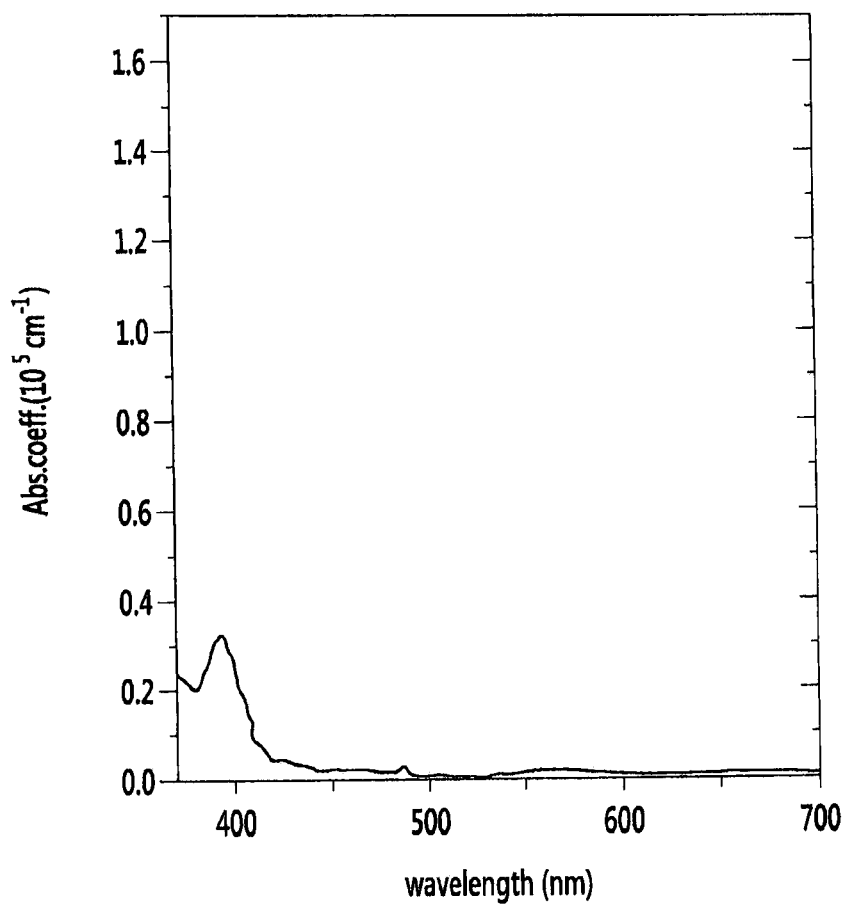
FIG. 8 is a graph showing light absorption characteristics of the compound represented by Chemical Formula 1bb.

FIG. 7 is a graph showing light absorption characteristics of the compound represented by the above Chemical Formula 1aa in the thin film state, and FIG. 8 is a graph showing light absorption characteristics of the compound represented by the above Chemical Formula 1bb in the thin film state.

Referring to FIGS. 7 and 8, the compounds represented by the above Chemical Formulae 1aa and 1bb do not substantially absorb visible light in a wavelength region of about 450 nm to about 700 nm. Also, referring to FIGS. 7 and 8, the transparent second compound has an absorption coefficient in a thin film state of less than or equal to about $0.4 \times 10^5$ $cm^{-1}$ in a wavelength region of about 400 nm to about 700 nm, for example, less than or equal to about $0.3 \times 10^5$ $cm^{-1}$ in a wavelength region of about 400 nm to about 700 nm, or for example, less than or equal to about $0.1 \times 10^5$ $cm^{-1}$ in a wavelength region of about 450 nm to about 700 nm.

On the other hand, light absorption characteristics of the compounds represented by the above Chemical Formulae 1cc to 1gg depending on a wavelength are evaluated through simulation (Gaussian 09 with B3LYP in the DFT mode, basis set: 6-31G**).

Figure 9:
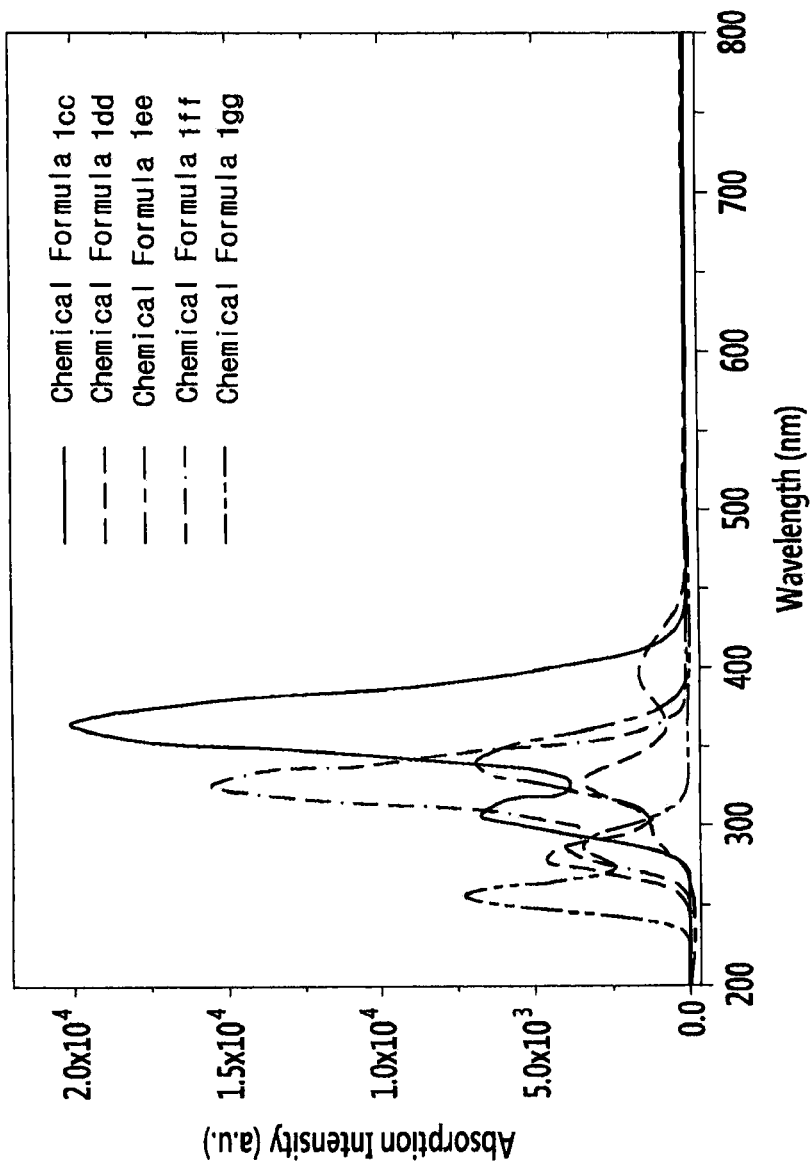
FIG. 9 is a graph showing light absorption characteristics of the compounds represented by Chemical Formulae 1cc to 1gg.

FIG. 9 is a graph showing light absorption characteristics of the compounds represented by Chemical Formulae 1cc to 1gg.

Referring to FIG. 9, the compounds represented by the above Chemical Formula 1cc to 1gg do not substantially absorb visible light in a wavelength region of about 450 nm to about 700 nm. Energy levels of the compounds represented by the above Chemical Formulae 1cc to 1gg are provided in Table 1.

TABLE 1

| | HOMO (eV) | LUMO (eV) | Eg (eV) |
|---|---|---|---|
| Chemical Formula 1cc | −7.036 | −3.410 | 3.626 |
| Chemical Formula 1dd | −6.759 | −3.105 | 3.655 |
| Chemical Formula 1ee | −7.021 | −2.773 | 4.248 |
| Chemical Formula 1ff | −6.984 | −2.667 | 4.317 |
| Chemical Formula 1gg | −7.604 | −3.157 | 4.447 |

Manufacture of Organic Photoelectronic Device

Example 1

An about 100 nm-thick anode is formed by sputtering ITO on a glass substrate, and a 30 nm-thick thin film as a charge auxiliary layer is formed thereon by using a molybdenum oxide ($MoO_x$, $0<x\leq3$). Subsequently, a 70 nm-thick active layer is formed on the molybdenum oxide thin film by codepositing a compound represented by the following Chemical Formula 2a (a p-type semiconductor compound) and a compound represented by the above Chemical Formula 1aa (an n-type semiconductor compound) in a thickness ratio of 1:1. Then, an 80 nm-thick second electrode is formed on the active layer by sputtering Al, manufacturing an organic photoelectronic device.

[Chemical Formula 2a]

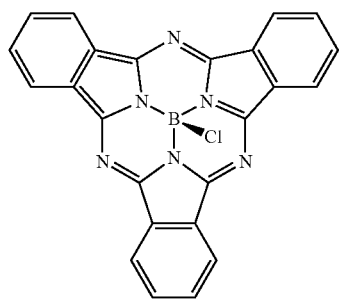

Example 2

An organic photoelectronic device is manufactured according to the same method as Example 1, except for forming the active layer to be 90 nm thick.

Example 3

An organic photoelectronic device is manufactured according to the same method as Example 1, except for using the p-type semiconductor compound and the n-type semiconductor compound in a thickness ratio of 2:1 to form a 105 nm-thick active layer.

Example 4

An organic photoelectronic device is manufactured according to the same method as Example 1, except for using the p-type semiconductor compound and the n-type semiconductor compound in a thickness ratio of 5:1 to form an 84 nm-thick active layer.

Example 5

An organic photoelectronic device is manufactured according to the same method as Example 1, except for using the p-type semiconductor compound and the n-type semiconductor compound in a thickness ratio of 10:1 to form a 77 nm-thick active layer.

Example 6

An organic photoelectronic device is manufactured according to the same method as Example 1, except for using a compound represented by the above Chemical Formula 1bb as the n-type semiconductor and using the p-type semiconductor compound and the n-type semiconductor compound in a thickness ratio of 1:2 to form a 70 nm-thick active layer.

Evaluation II

External quantum efficiency (EQE) of the organic photoelectronic devices according to Examples 1 to 6 depending on a wavelength is evaluated.

The external quantum efficiency is measured by using an IPCE measurement system (McScience Co., Ltd., Korea). First of all, the IPCE measurement system is calibrated by using a Si photodiode (Hamamatsu Photonics K.K., Japan) mounted in the organic photoelectronic devices according to Examples 1 and 2 and Comparative Example 1, and their external quantum efficiency is measured in a wavelength region of about 350 to 750 nm.

Figure 10:
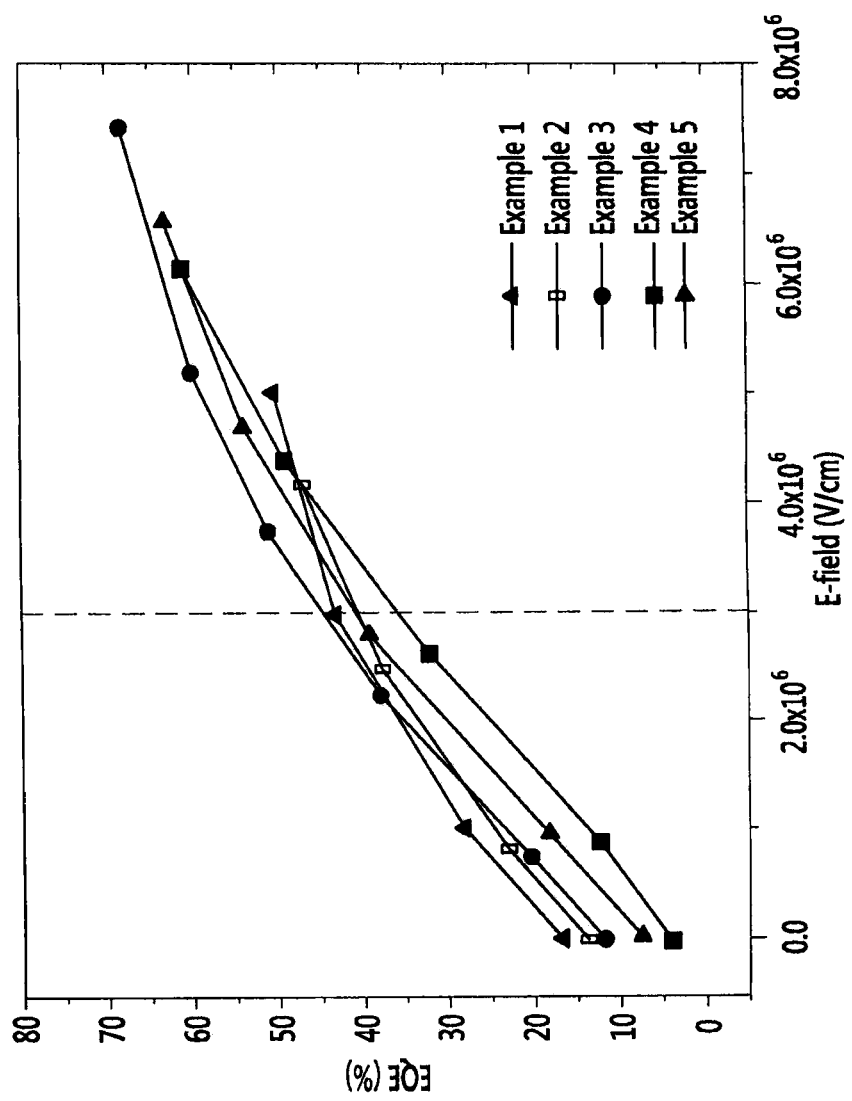
FIG. 10 is a graph showing external quantum efficiency (EQE) depending on an applied electric field of the organic photoelectronic devices according to Examples 1 to 5.
Figure 11:
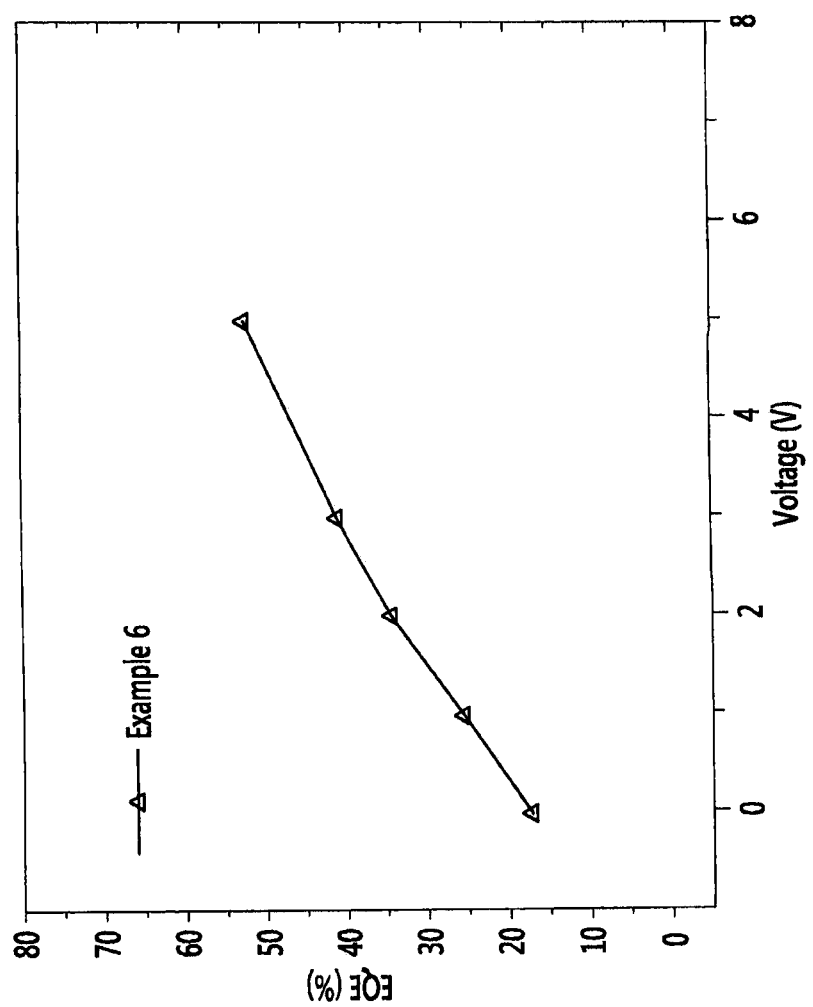
FIG. 11 is a graph showing external quantum efficiency (EQE) depending on an applied electric field of the organic photoelectronic device according to Example 6.

The results are provided in FIGS. 10 and 11. FIG. 10 is a graph showing external quantum efficiency (EQE) depending on an applied electric field of the organic photoelectronic devices according to Examples 1 to 5, and FIG. 11 is a graph showing external quantum efficiency (EQE) depending on an applied electric field of the organic photoelectronic device according to Example 6.

Referring to FIGS. 10 and 11, the organic photoelectronic devices according to Examples 1 to 6 show sufficient external quantum efficiency (EQE) in a green wavelength region of about 500 nm to 600 nm.

Evaluation III

The external quantum efficiency of the organic photoelectronic devices according to Examples 1, 3, 5, and 6 measured in Evaluation II is normalized. Subsequently, the width of a wavelength corresponding to a half of a maximum external quantum efficiency point in the normalized external quantum efficiency graph depending on a wavelength, that is, a full width at half maximum (FWHM), regarding the external quantum efficiency is evaluated.

Figure 12:
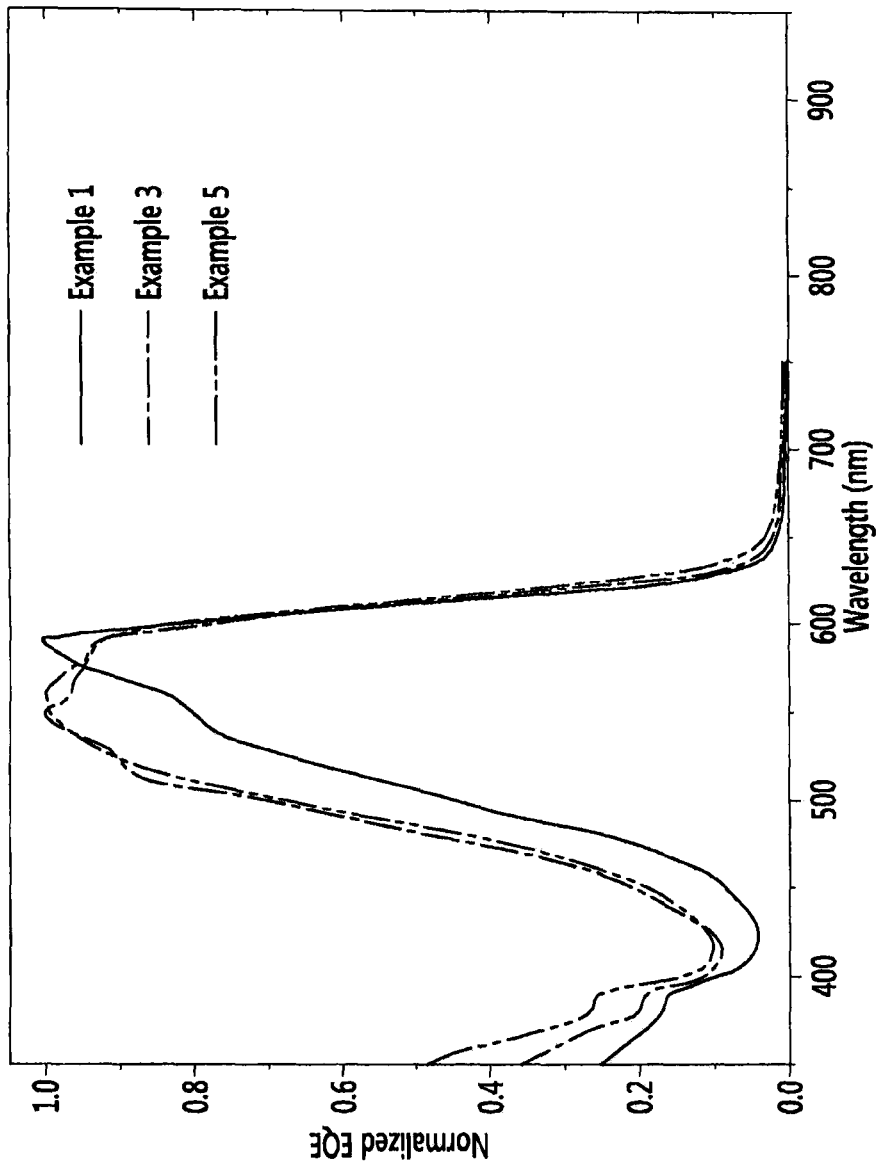
FIG. 12 is a graph showing external quantum efficiency (EQE) depending on a wavelength at 3 V of the organic photoelectronic devices according to Examples 1, 3, and 5.
Figure 13:
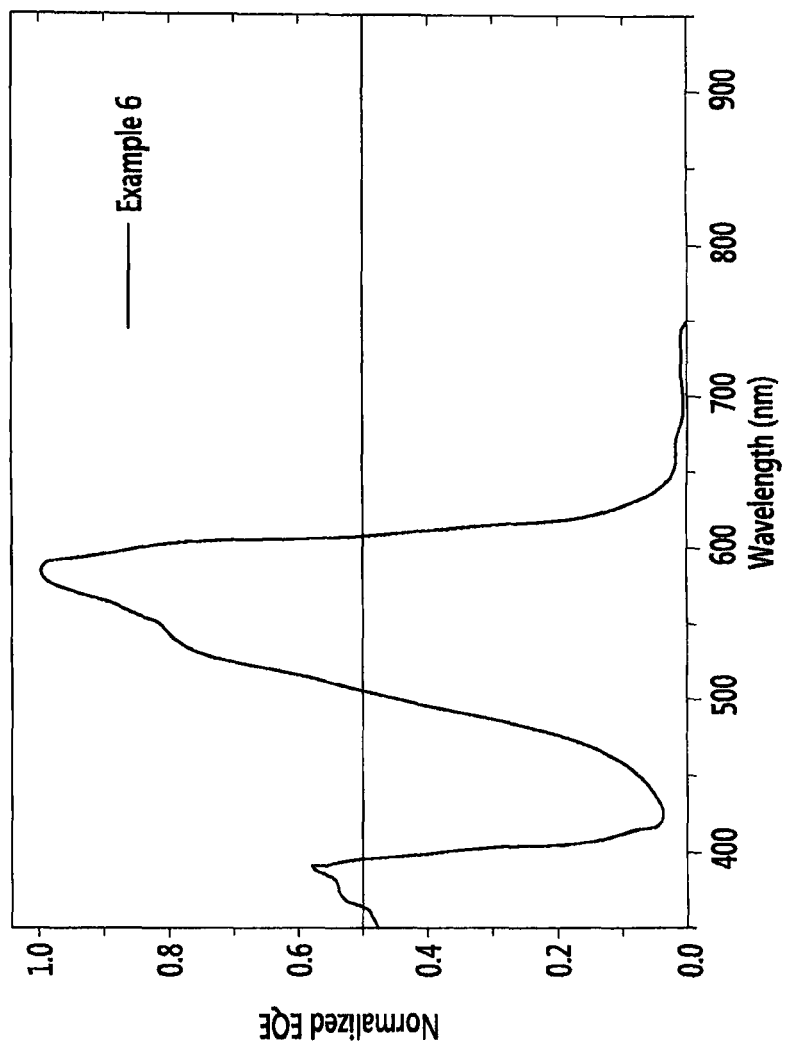
FIG. 13 is a graph showing external quantum efficiency (EQE) depending on a wavelength at 3 V of the organic photoelectronic device according to Example 6.

The results are provided in FIGS. 12 and 13 and Table 2.

TABLE 2

| | FWHM (nm) (normalized EQE) |
|---|---|
| Example 1 | 105 |
| Example 3 | 130 |
| Example 5 | 129 |
| Example 6 | 103 |

FIG. 12 is a graph showing external quantum efficiency (EQE) depending on a wavelength at 3 V of the organic photoelectronic devices according to Examples 1, 3, and 5, and FIG. 13 is a graph showing external quantum efficiency (EQE) depending on a wavelength at 3 V of the organic photoelectronic device according to Example 6.

Referring to FIGS. 12 and 13 and Table 2, the organic photoelectronic devices according to Examples 1, 3, 5, and 6 show sufficient external quantum efficiency (EQE) and a relatively small full width at half maximum (FWHM) in a green wavelength region of 500 nm to 600 nm. Accordingly, the organic photoelectronic devices turns out to have relatively high wavelength selectivity regarding light in a green wavelength region.

Evaluation IV

Dark current density of the organic photoelectronic devices according to Examples 3 to 6 is evaluated.

The dark current density is measured by using Keithley 4200 equipment (a semiconductor parameter analyzer).

Figure 14:
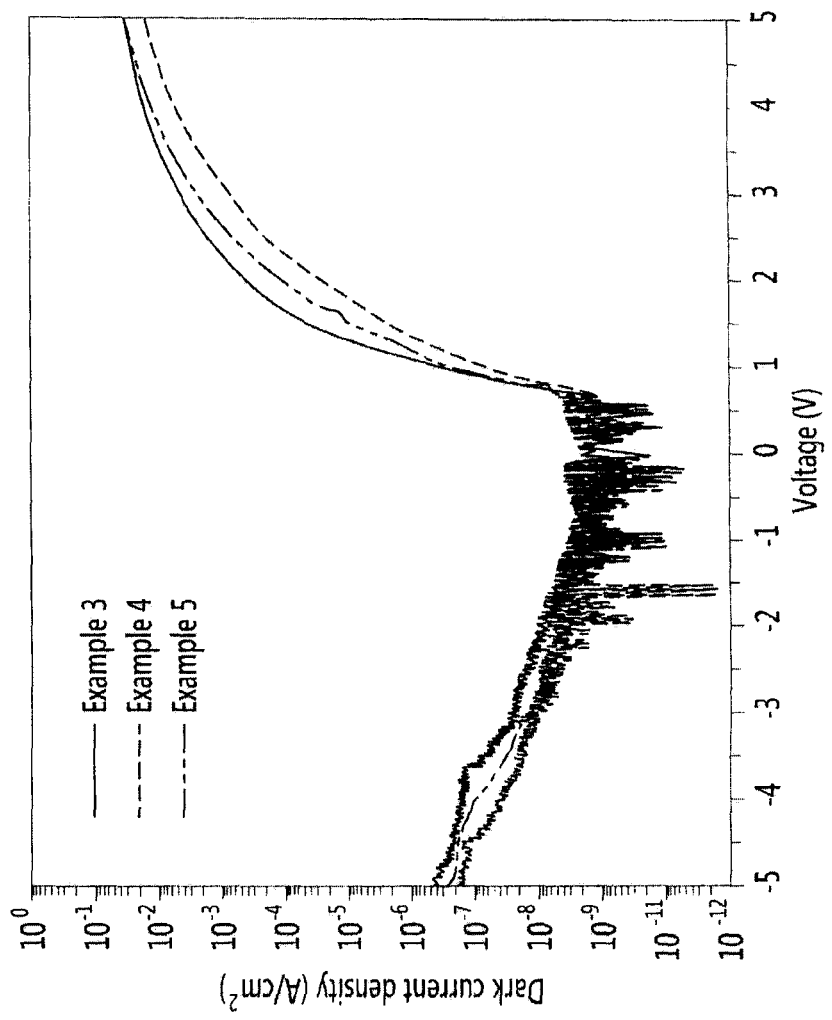
FIG. 14 is a graph showing dark current density depending on an applied voltage of the organic photoelectronic devices according to Examples 3 to 5.
Figure 15:
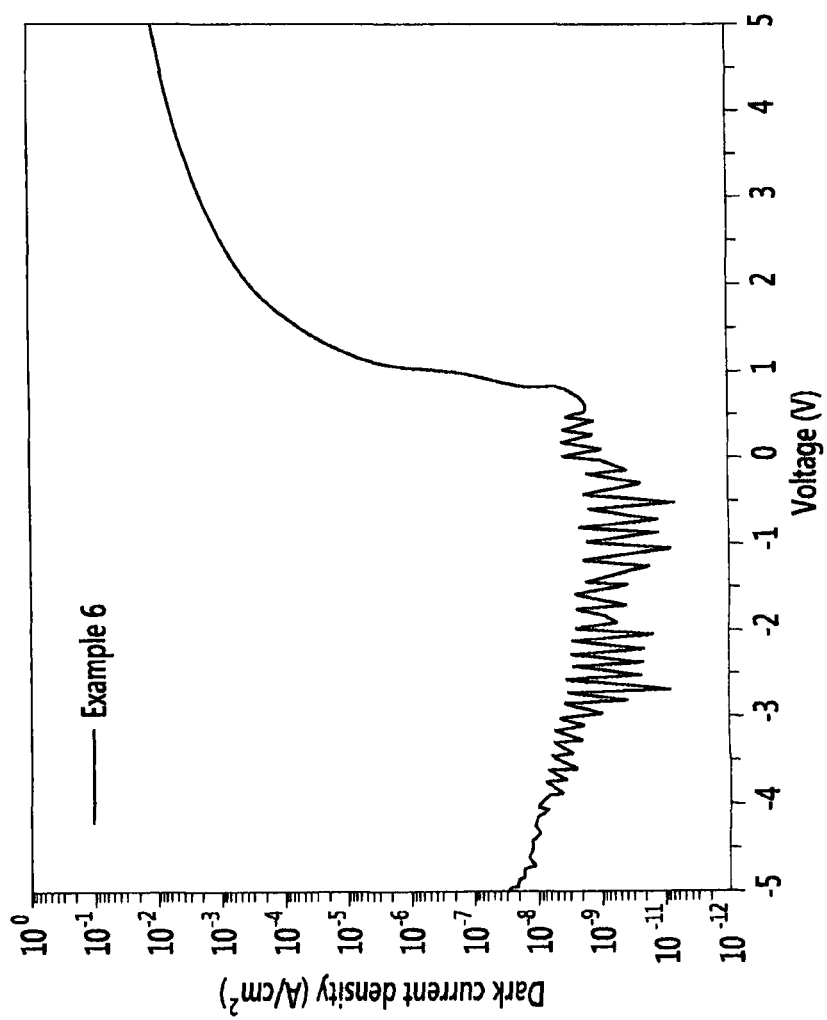
FIG. 15 is a graph showing dark current density depending on an applied voltage of the organic photoelectronic device according to Example 6.

FIG. 14 is a graph showing dark current density depending on an applied voltage of the organic photoelectronic devices according to Examples 3 to 5, and FIG. 15 is a graph showing dark current density depending on an applied voltage of the organic photoelectronic device according to Example 6.

Referring to FIGS. 14 and 15, the organic photoelectronic devices according to Examples 3 to 5 show relatively small dark charge leakage current without a separate hole blocking layer. Accordingly, the light absorption layer used in the organic photoelectronic devices is expected to block holes inflowing from the outside as well as to maintain photoelectric conversion characteristics.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic photoelectronic device, comprising:
    a first electrode and a second electrode facing each other; and
    an active layer between the first electrode and the second electrode, the active layer including,
        a first compound having a maximum absorption wavelength of about 500 nm to about 600 nm in a visible ray region, and
        a transparent second compound in a visible ray region, the transparent second compound having an absorption coefficient in a thin film state of less than or equal to about $0.1 \times 10^5$ cm$^{-1}$ in a wavelength region of about 450 nm to about 700 nm.

2. The organic photoelectronic device of claim 1, wherein the transparent second compound has an energy bandgap of greater than or equal to about 2.8 eV.

3. The organic photoelectronic device of claim 1, wherein the active layer has a thickness of about 1 nm to about 500 nm.

4. The organic photoelectronic device of claim 1, wherein the transparent second compound has a HOMO level of greater than about 6.0 eV.

5. The organic photoelectronic device of claim 1, wherein the difference between the HOMO level of the transparent second compound and the work function of the second electrode is greater than or equal to about 1.5 eV.

6. The organic photoelectronic device of claim 1, wherein the transparent second compound is represented by the following Chemical Formula 1:

[Chemical Formula 1]

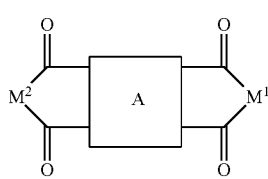

wherein, in the Chemical Formula 1,
    A is one of a substituted or unsubstituted $C_6$ to $C_{30}$ aromatic ring group, a substituted or unsubstituted $C_3$ to $C_{30}$ hetero aromatic ring group, and a combination thereof, and
    each of $M^1$ and $M^2$ are independently one of oxygen (—O—) and —NR$^0$—, wherein R$^0$ is one of hydrogen, a substituted or unsubstituted $C_1$ to $C_{30}$ alkyl group, a substituted or unsubstituted $C_3$ to $C_{30}$ cycloalkyl group, a halogen atom, a halogen-containing group, and a combination thereof.

7. The organic photoelectronic device of claim 6, wherein the transparent second compound is represented by one of the following Chemical Formulae 1a to 1e:

[Chemical Formula 1a]

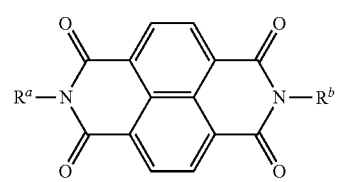

[Chemical Formula 1b]

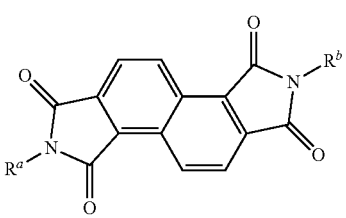

[Chemical Formula 1c]

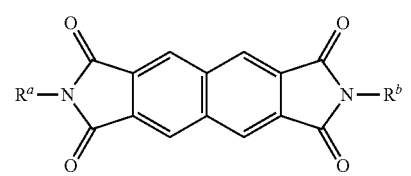

[Chemical Formula 1d]

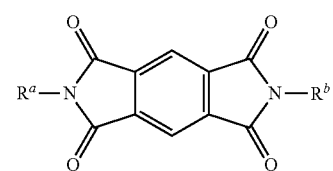

[Chemical Formula 1e]

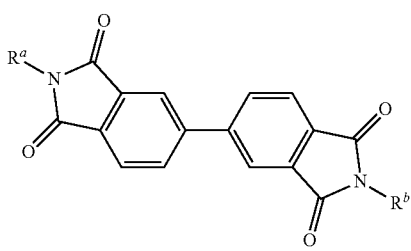

wherein, in the Chemical Formulae 1a to 1e,
    each of R$^a$ and R$^b$ are independently one of hydrogen, a substituted or unsubstituted $C_1$ to $C_{30}$ alkyl group, a substituted or unsubstituted $C_3$ to $C_{30}$ cycloalkyl group, a halogen atom, a halogen-containing group, and a combination thereof.

8. The organic photoelectronic device of claim 1, wherein the first compound comprises N,N'-dimethylquinacridone (DMQA), N,N'-dimethyl-2,9-dimethylquinacridone (DM-MQA), a compound represented by the following Chemical Formula 2, or a combination thereof:

[Chemical Formula 2]

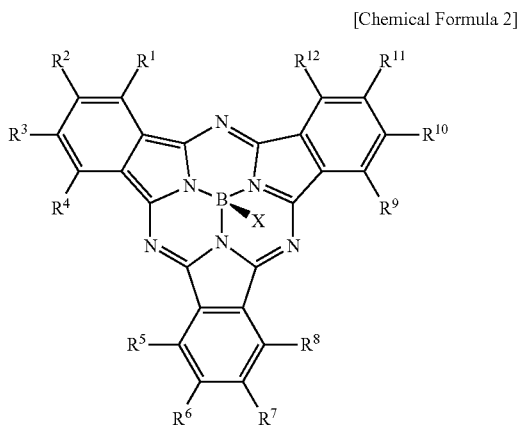

wherein, in the Chemical Formula 2,
each of $R^1$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and
X is an anion.

9. The organic photoelectronic device of claim 1, wherein the first compound has an energy bandgap of greater than or equal to about 2.0 eV and less than or equal to about 2.5 eV.

10. The organic photoelectronic device of claim 1, wherein the first compound has a maximum absorption wavelength ($\lambda_{max}$) of about 530 nm to about 600 nm.

11. The organic photoelectronic device of claim 1, wherein the active layer shows a light absorption curve having a full width at half maximum (FWHM) of about 50 nm to about 200 nm.

12. The organic photoelectronic device of claim 1, wherein the active layer shows a light absorption curve having a full width at half maximum (FWHM) of about 50 nm to about 150 nm.

13. The organic photoelectronic device of claim 1, wherein
the first compound is a p-type semiconductor, and
the transparent second compound is an n-type semiconductor.

14. The organic photoelectronic device of claim 1, wherein the active layer selectively absorbs light in a green wavelength region.

15. The organic photoelectronic device of claim 1, wherein a hole blocking layer is not between the first electrode and the active layer and between the second electrode and the active layer.

16. An image sensor including the organic photoelectronic device of claim 1.

17. The image sensor of claim 16, further comprising:
a semiconductor substrate integrated with a first photo-sensing device sensing light in a blue wavelength region and a second photo-sensing device sensing light in a red wavelength region,
wherein the organic photoelectronic device is on the semiconductor substrate and absorbs light in a green wavelength region.

18. The image sensor of claim 17, wherein the first photo-sensing device and the second photo-sensing device are positioned at a different depth from the surface of the semiconductor substrate.

19. The image sensor of claim 17, further comprising:
a color filter layer on or under the organic photoelectronic device.

20. The image sensor of claim 19, wherein
the color filter layer is between the semiconductor substrate and the organic photoelectronic device, and
the color filter layer includes,
a first color filter corresponding to the first photo-sensing device and selectively transmitting light in a blue region, and
a second color filter corresponding to the second photo-sensing device and selectively transmitting light in a red region.

21. The organic photoelectronic device of claim 1, wherein
the first compound is a p-type semiconductor,
the transparent second compound is an n-type semiconductor, and
the p-type semiconductor and the n-type semiconductor form a pn junction.

22. An organic photoelectronic device, comprising:
a first electrode and a second electrode facing each other; and
an active layer between the first electrode and the second electrode, the active layer including,
a first compound having a maximum absorption wavelength of about 500 nm to about 600 nm in a visible ray region, and
a transparent second compound in a visible ray region, the transparent second compound having an absorption coefficient in a thin film state of less than or equal to about $0.4 \times 10^5$ cm$^{-1}$ in a wavelength region of about 400 nm to about 700 nm.

23. The organic photoelectronic device of claim 22, wherein the transparent second compound has an absorption coefficient in a thin film state of less than or equal to about $0.3 \times 10^5$ cm$^{-1}$ in a wavelength region of about 450 nm to about 700 nm.

* * * * *